(12) United States Patent
Lin

(10) Patent No.: US 6,880,955 B2
(45) Date of Patent: Apr. 19, 2005

(54) LAMP ON SHEET AND MANUFACTURING METHOD THEREOF

(76) Inventor: Yuan Lin, 5 Viewmont Ct., Doncaster East, 3109 VIC. (AU)

( * ) Notice: Subject to any disclaimer, the term of this patent is extended or adjusted under 35 U.S.C. 154(b) by 0 days.

(21) Appl. No.: 10/147,889

(22) Filed: May 20, 2002

(65) Prior Publication Data
US 2003/0137839 A1 Jul. 24, 2003

(30) Foreign Application Priority Data
Jan. 24, 2002 (TW) ........................................ 91101307 A

(51) Int. Cl.[7] ........................................... F21V 21/005
(52) U.S. Cl. ........................ 362/249; 362/391; 362/800
(58) Field of Search ................................. 362/249, 800, 362/250–252, 391; 313/511, 512; 445/23; 338/212; 257/737; 156/67

(56) References Cited

U.S. PATENT DOCUMENTS

| | | | | |
|---|---|---|---|---|
| 4,514,791 A | * | 4/1985 | Tokieda | 362/249 |
| 4,823,106 A | * | 4/1989 | Lovell | 338/212 |
| 5,550,408 A | * | 8/1996 | Kunitomo et al. | 257/737 |
| 2002/0149933 A1 | * | 10/2002 | Archer et al. | 362/234 |

* cited by examiner

Primary Examiner—Sandra O'Shea
Assistant Examiner—Mark Tsidulko
(74) Attorney, Agent, or Firm—Troxell Law Office, PLLC

(57) ABSTRACT

A method of manufacturing lamps on sheets comprises pressing a continuous upper strip, an intermediate conductor assembly, and a continuous lower strip into a continuous strip assembly having a plurality of holes; mounting a light source assembly on the stip assembly to form a continuous strip of lamps; and cutting the continuous strip of lamps into a plurality of sheets each having at least one lamp with a predetermined length of strip wherein the conductor assembly is secured in the strip assembly.

16 Claims, 6 Drawing Sheets

LAMP ON SHEET AND MANUFACTURING METHOD THEREOF

BACKGROUND OF THE INVENTION

1. Field of the Invention

The present invention relates to a lamp on sheet and manufacturing method thereof and more particularly to a lamp on sheet which is formed from a continuous strip of, for example, plastic laminated material in a manufacturing process.

2. Description of Related Art

It is well known that lamps have many shapes and functions depending on applications. Also, various methods are proposed for manufacturing one type of lamp in the art. Based on above, after considerable research and experimentation, the inventor of the present invention devises a novel method of manufacturing a desirable lamp on sheet.

SUMMARY OF THE INVENTION

It is an object of the present invention to provide a method of manufacturing lamps on sheets comprising the steps of pressing a continuous upper strip, an intermediate conductor assembly, and a continuous lower strip into a continuous strip assembly having a plurality of holes therealong being communication with the conductor assembly; mounting a light source assembly on the strip assembly to form a continuous strip of lamps; and cutting the continuous strip of lamps into a plurality of sheets each having at least one lamp wherein the conductor assembly is secured in the strip assembly. By utilizing this method, a mass production having the benefit of lower manufacturing cost is made possible.

It is another object of the present invention to provide a lamp on sheet comprising an intermediate conductor assembly including two parallel continuous strips of foils; a strip assembly including an upper strip having a plurality of holes therealong being communication with the conductor assembly and a lower strip; and a light source assembly wherein the strips of foils are secured between the upper and the lower strips.

In one aspect of the present invention, the strip assembly is selected from a PP, a PVC, a thin plastic material, a fireproof fabric, a glass-fiber, or an asbestos.

In another aspect of the present invention, the light source assembly is implemented as a plurality of SMD LEDs, LED dice bondings, LED Lamp or mini bulbs.

The above and other objects, features and advantages of the present invention will become apparent from the following detailed description taken with the accompanying drawings.

DETAILED DESCRIPTION OF THE PREFERRED EMBODIMENTS

Figure 1:
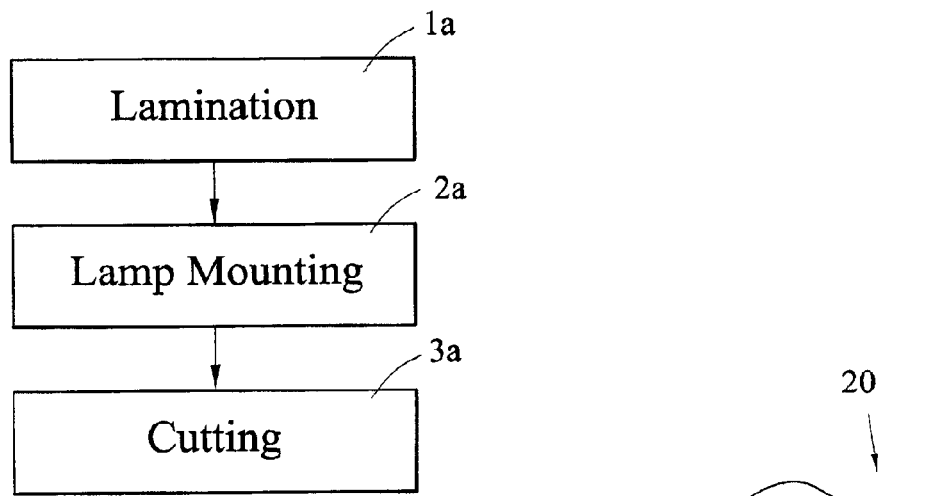
FIG. 1 is a flow chart illustrating a first preferred embodiment of lamp manufacturing method according to the invention.
Figure 2:
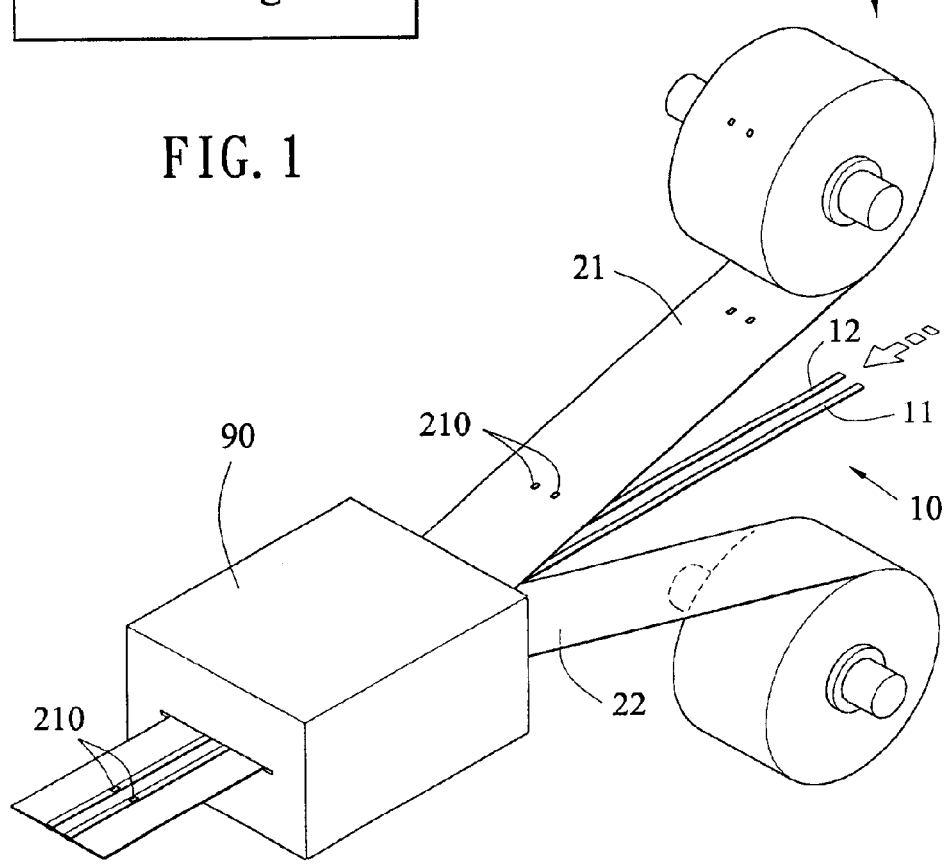
FIG. 2 is a perspective view schematically showing a lamination process performed by device of the invention.
Figure 3:
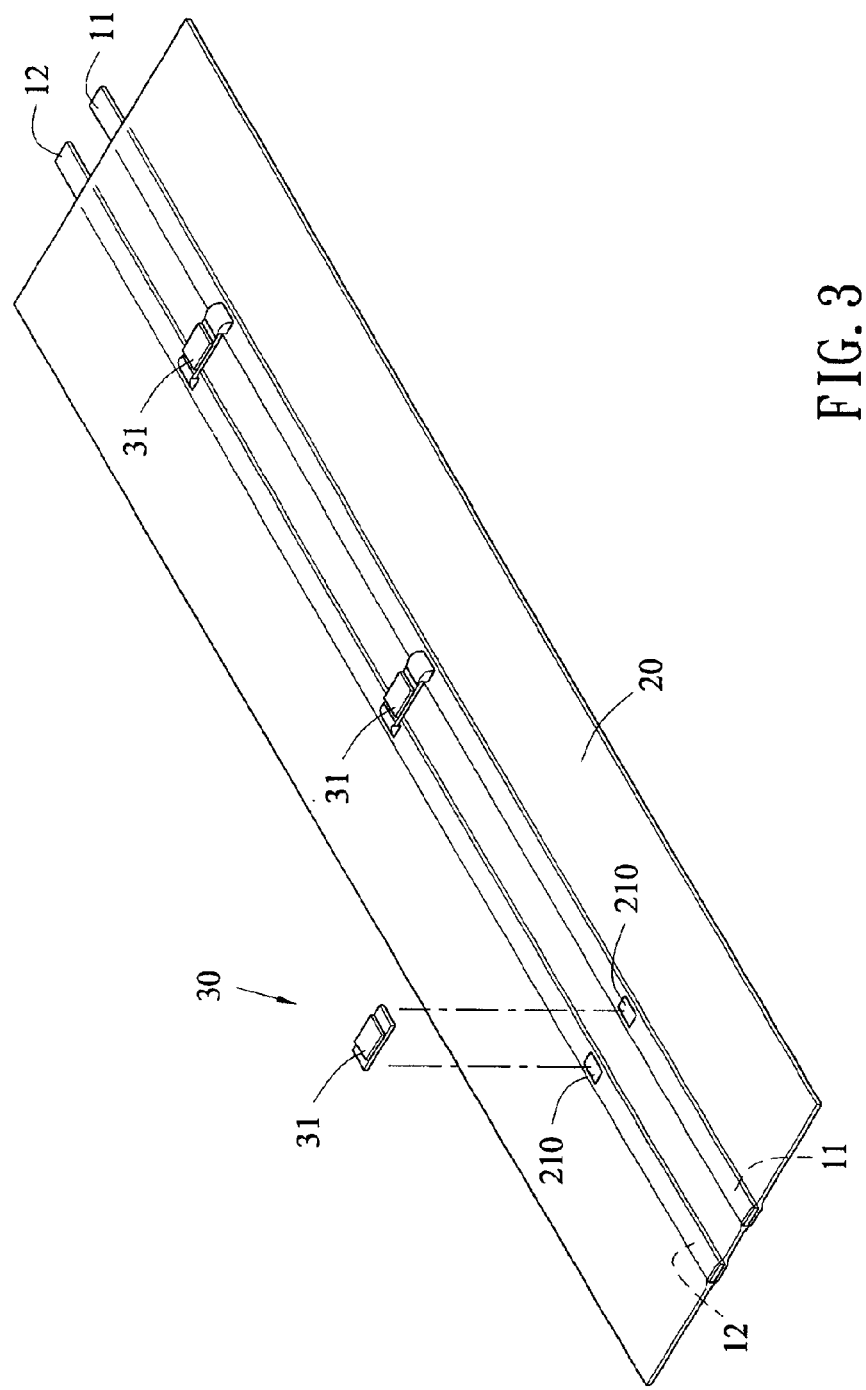
FIG. 3 is a perspective view in part exploded of a portion of continuous strip of plastic laminated material of FIG. 2.
Figure 4:
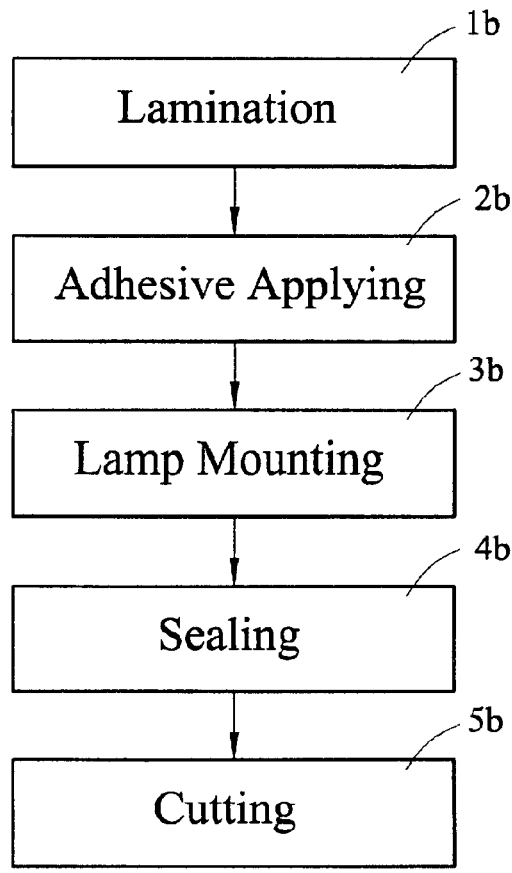
FIG. 4 is a flow chart illustrating a second preferred embodiment of lamp manufacturing method according to the invention.
Figure 5:
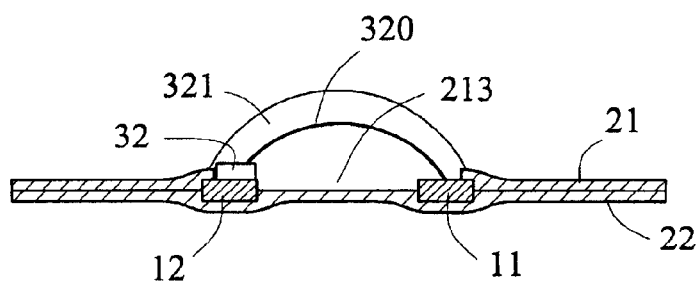
FIG. 5 is a cross-sectional view of lamp on sheet manufactured according to the second preferred embodiment of FIG. 4.
Figure 7:
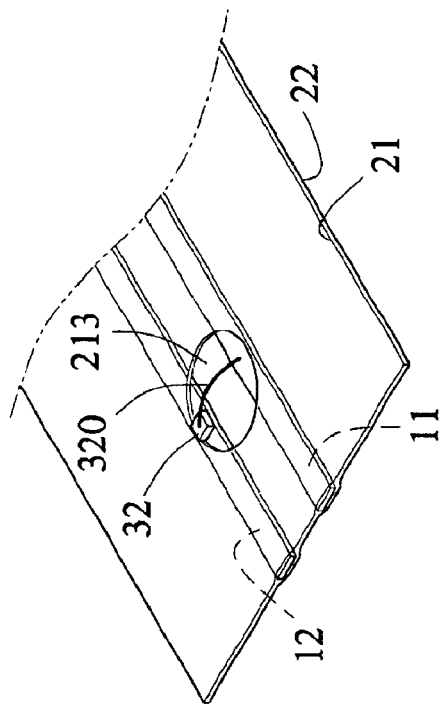
FIG. 7 is a perspective view in part exploded showing a lamp mounting process performed on a continuous strip of plastic laminated material according to the second preferred embodiment of FIG. 4.

Referring to FIGS. 1 to 3, there is shown a first preferred embodiment of lamp manufacturing method in accordance with the invention. A first step of the method is a lamination process 1a wherein a laminator 90 is utilized to press a continuous upper strip 21 of strip assembly 20 fed from a first supply spool, an intermediate conductor assembly 10 including two parallel continuous strips of foils 11 and 12, and a continuous lower strip 22 of strip assembly 20 fed from a second supply spool into a continuous strip assembly 20. As to strip assembly 20, it is selectable from PP, PVC, thin plastic material, fireproof fabric, glass-fiber, or asbestos. Further, a plurality of equally spaced pairs of holes 210 are formed on upper strip 21 above the continuous strips of foils 11 and 12 so as to expose portions of the continuous strips of foils 11 and 12. A second step is a lamp mounting process 2a wherein a plurality of SMD LEDs (light emitting diodes) 31 of a light source assembly 30 are mounted on strip assembly 20. In detail, each SMD LED 31 is mounted across one pair of holes 210. This forms a continuous strip of lamps. A third step is a cutting process 3a wherein a cutter (not shown) is utilized to cut the continuous strip of lamps into a plurality of units each having at least one lamp depending on applications. Note that in this preferred embodiment each unit has at least one lamp, i.e., at least one lamp on sheet.

The features of the first preferred embodiment of the invention are as follows: The bottom of conductor assembly 10 is covered by lower strip 22. Foils 11 and 12 are secured in each unit since upper and lower strips 21 and 22 are pressed firmly together. Hence, the possibility of short circuit caused by contacting the strips of foils 11 and 12 is substantially eliminated. Moreover, each unit has a better flexibility. Note that the order of performing steps 2a and 3a may be reversed in other embodiment, i.e., step 3a performed prior to step 2a is still applicable.

Figure 6:
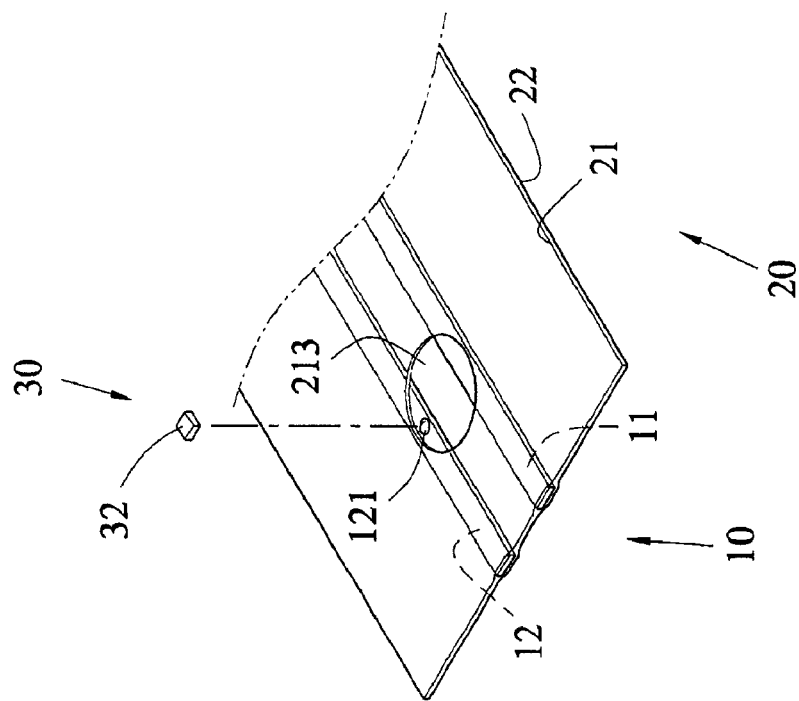
FIG. 6 is a perspective view in part exploded showing an adhesive applying process performed on a continuous strip of plastic laminated material according to the second preferred embodiment of FIG. 4.

Referring to FIGS. 4 to 7, there is shown a second preferred embodiment of lamp manufacturing method in accordance with the invention. A first step of the method is a lamination process 1b which is substantially the same as that illustrated in the first preferred embodiment. Thus a detailed description thereof is omitted herein except the following. A plurality of equally spaced rounded holes 213 larger than holes 210 are formed on upper strip 21. Further, portions of foils 11 and 12 are exposed to large holes 213. A second step is an adhesive applying process 2b wherein an adhesive 121 is applied on one of foils 11 and 12 (foil 12 as shown in FIG. 6) which is exposed to large hole 213. Next, a LED dice bonding 32 is adhered onto the point of the adhesive 121 of foil 12. A third step is a lamp mounting process 3b wherein an aluminum wire 320 (or gold wire in other embodiment) is bonded across the spacing from the LED dice bonding 32 to foil 11 by means of ultrasonic bonding device (not shown). A fourth step is a sealing process 4b wherein a layer of epoxy resin 321 is sealed and covered on LED dice bonding 32, aluminum wire 320, and large hole 213. A fifth step is a cutting process 5b which is substantially the same as that illustrated in the first preferred embodiment. Thus a detailed description thereof is omitted herein. The features of the second preferred embodiment are the same as that of the first preferred embodiment. Thus a detailed description thereof is omitted herein. Note that the order of performing steps 2b, 3b, 4b, and 5b may be partially reversed in other embodiment, i.e., an order of performing steps 5b, 2b, 3b, and 4b is also applicable.

Figure 9:
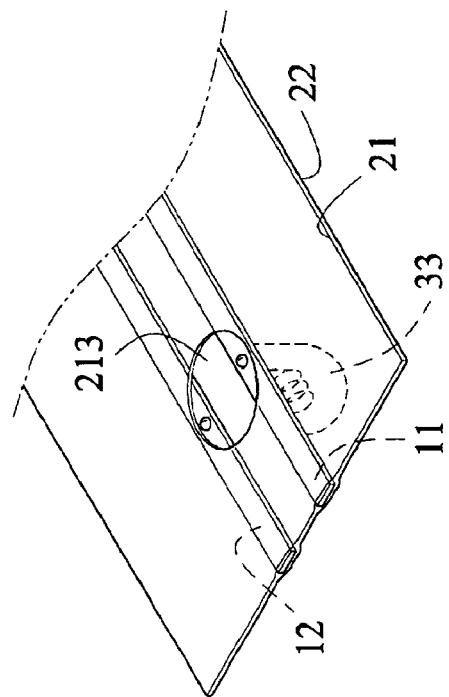
FIG. 9 is a perspective view in part exploded showing a soldering process performed on a continuous strip of plastic laminated material according to the third preferred embodiment of the invention.
Figure 8:
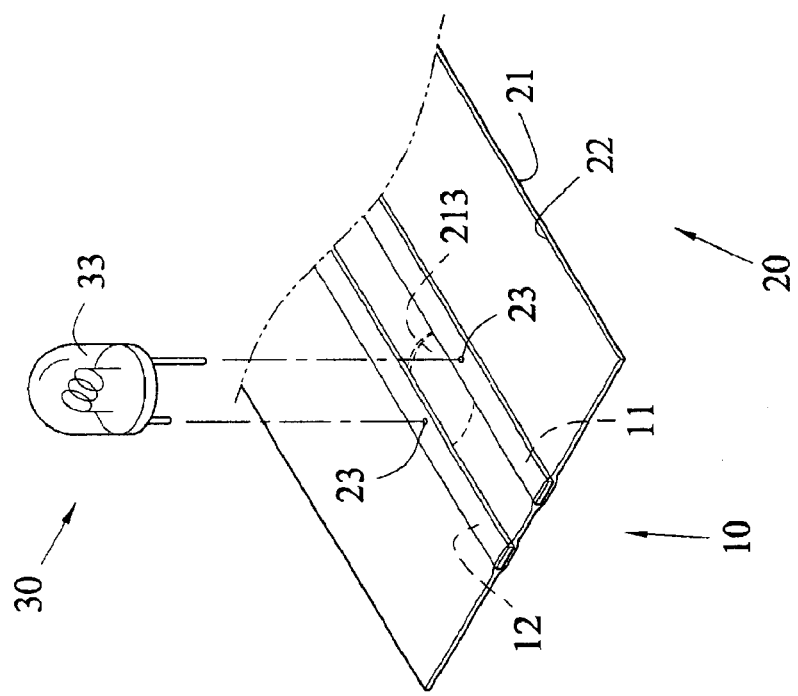
FIG. 8 is a perspective view in part exploded showing a lamp mounting process performed on a continuous strip of plastic laminated material according to a third preferred embodiment of the invention.
Figure 10:
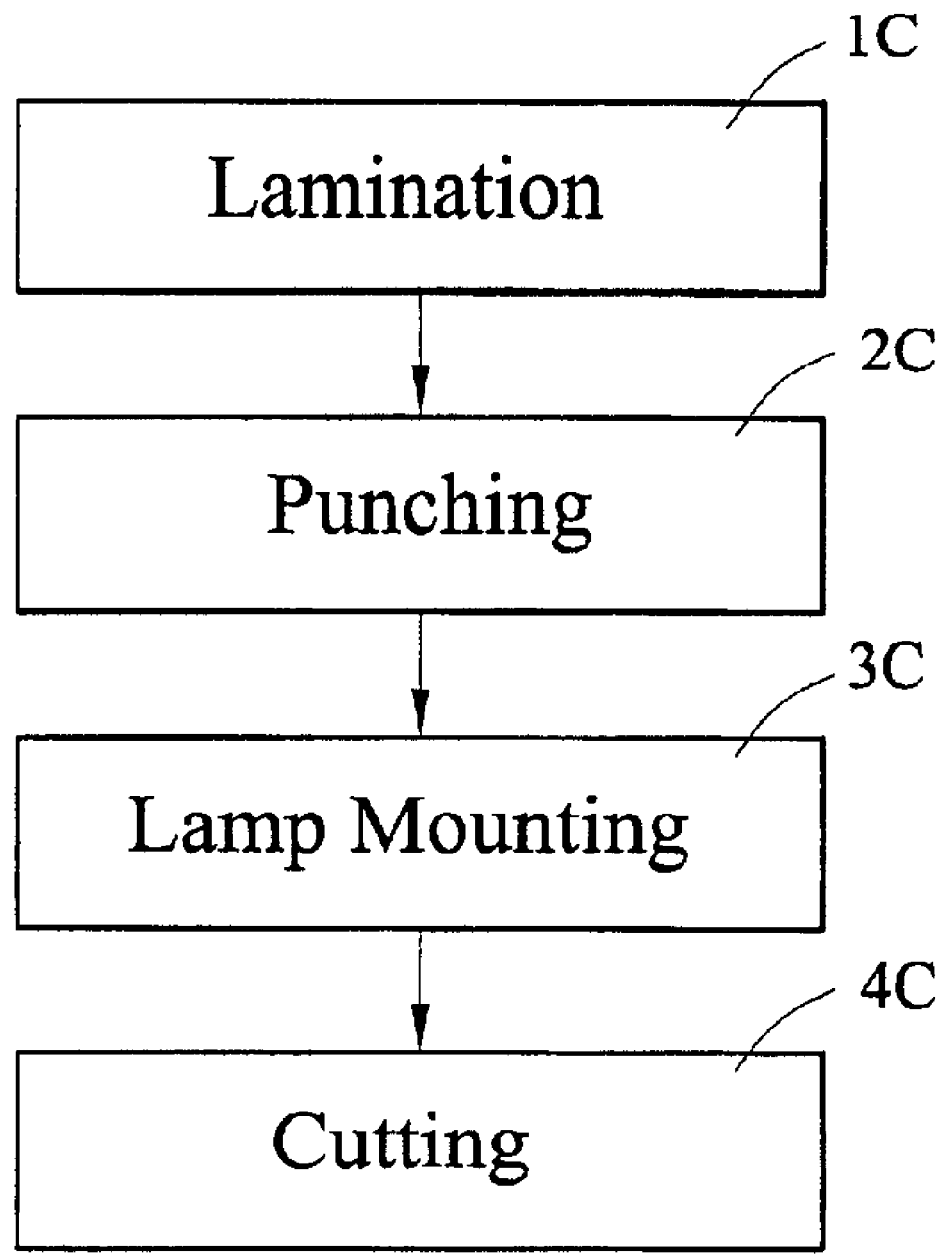
FIG. 10 is a flow chart illustrating the third preferred embodiment of lamp manufacturing method according to the invention.

Referring to FIGS. 8 to 10, there is shown a third preferred embodiment of lamp manufacturing method in accordance with the invention. The constructions of conductor assembly 10 and strip assembly 20 are the same as that shown in the second preferred embodiment while light source assembly 30 is implemented as a plurality of mini bulbs (or LED Lamp) 33. A first step of the method is a lamination process 1c which is substantially the same as that illustrated in the second preferred embodiment. Thus a detailed description thereof is omitted herein. A second step is a punching process 2c wherein a pair of holes 23 are punched on foils 11 and 12 respectively in a direction from upper strip 21 to lower strip 22. A third step is a lamp mounting process 3c wherein pins of a mini bulb (or LED Lamp) 33 are inserted through lower strip 22 and holes 23 prior to securing on foils 11 and 12 by soldering. A fourth step is a cutting process 4c which is substantially the same as that illustrated in the first preferred embodiment. Thus a detailed description thereof is omitted herein.

The features of the third preferred embodiment are the same as that of the first preferred embodiment. Thus a detailed description thereof is omitted herein. Note that the order of performing steps 2c, 3c and 4c may be partially reversed in other embodiment, i.e., an order of performing steps 4c, 2c, and 3c is also possible.

Note that in the second preferred embodiment, upper strip 21 is used as both mounting surface and securing surface. That is, light source assembly 30 is mounted on and secured to upper strip 21. Further, in the third preferred embodiment the mounting surface is lower strip 22 (i.e., light source assembly 30 is mounted on lower strip 22 which is contrary to that of the second preferred embodiment in which strip assembly 20 is inverted prior to mounting light source assembly 30). But the securing surface is upper strip 21 in both second and third preferred embodiments. It is noted that the constructions of conductor assembly 10 and strip assembly 20 are the same in both second and third preferred embodiments with the only difference of requiring the formed continuous strip assembly 20 by laminator 90 to invert in the manufacturing process prior to performing the step of mounting light source assembly 30 on lower strip 22.

It is also noted that conductor assembly 10 may comprise a plurality of pairs of continuous strips of foils 11 and 12 for increasing the illuminant effect thereof in other embodiment.

Moreover, the lamination process performed in laminator 90 may be effected by direct heating, high frequency heating, or adhesive heating for securing conductor assembly 10 in the continuous strip assembly 20.

In brief, the characteristics of the invention comprise an intermediate conductor assembly 10 including two parallel continuous strips of foils; a strip assembly 20 including an upper strip 21 having a plurality of holes therealong being communication with the conductor assembly 10 and a lower strip 22; and a light source assembly 30 mounted on the strip assembly 20 to form a continuous strip of lamps. The benefits of the lamp of the invention are detailed below. It is easy to manufacture. The securing of conductor assembly 10 and light source assembly 30 is reliable. The strip assembly 20 is maintained well during the securing process of light source assembly 30, thereby preserving an appearance of the lamp of sheet. Most importantly, its quality is high.

While the invention herein disclosed has been described by means of specific embodiments, numerous modifications and variations could be made thereto by those skilled in the art without departing from the scope and spirit of the invention set forth in the claims.

What is claimed is:

1. A method of manufacturing lamps on sheets comprising the steps of:
   (a) utilizing a laminator to press a continuous upper strip having a plurality of equally spaced pairs of holes, an intermediate conductor assembly including two parallel continuous strips of foils, and a continuous lower strip into a continuous strip assembly, such that the plurality of equally spaced pairs of holes on the upper strip align with and expose an upper surface of the two strips of foils and the continuous strips of foils are out of electrical contact with each other;
   (b) mounting two terminals of each of a plurality of SMD LEDs of a light source assembly across one pair of holes on the upper strip and electrically connecting one of the two terminals of each SMD LED to an exposed upper surface of one of said two parallel continuous strips of foils through one of said pairs of holes to form a continuous strip of lamps; and
   (c) cutting the continuous strip of lamps into a plurality of sheets each having at least one lamp;
   whereby a bottom of the conductor assembly is covered by the lower strip, the strips of foils are secured in each sheet so that a short circuit caused by contacting the upper and the lower strips is substantially eliminated, and each sheet is flexible.

2. The method of claim 1, further comprising sequentially performing the steps of (a), (c) and (b).

3. A method of manufacturing lamps on sheets comprising the steps of:
   (a) utilizing a laminator to press a continuous upper strip, an intermediate conductor assembly including a first and a second continuous strip of foil, and a continuous lower strip into a continuous strip assembly, the upper strip having a plurality of equally spaced large rounded holes exposing upper surfaces of the strips of foils through the large rounded holes, the first and the second continuous strips of foil being parallel and the continuous strips of foils are out of electrical contact with each other;
   (b) applying an adhesive on the first strip of foil which is exposed within each large rounded hole and adhering each one of a plurality of LED device bondings of a light source assembly onto the adhesive;

(c) bonding a conducting member wire from the LED dice bonding to the second strip of foil;

(d) sealing a layer of epoxy resin on each pair of LED dice bonding and the large rounded hole to form a continuous strip of lamps; and (e) cutting the continuous strip of lamps into a plurality of sheets each having at least one light source assembly thereon;

whereby a bottom of the intermediate conductor assembly is covered by the lower strip, the strips of foils are secured between the strip and the lower strip such that a short circuit caused by contacting the upper and the lower strips is substantially eliminated, and each sheet is flexible.

4. The method of claim 3, further comprising sequentially performing the steps of (a), (e), (b), (c) and (d).

5. A method of manufacturing lamps on sheets comprising the steps of:

(a) utilizing a laminator to press a continuous upper strip, an intermediate conductor assembly including two parallel continuous strips of foils, and a continuous lower strip into a continuous strip assembly wherein a plurality of equally spaced pairs of holes are formed on the upper strip being communication with the strips of foils;

(b) punching a plurality of pairs of holes on the strips of foils respectively in a direction from the upper strip to the lower strip;

(c) inserting a pair of pins of a plurality of mini bulbs (LED lamp) of a light source assembly through the lower strip and the holes prior to securing on the strips of foils by soldering to form a continuous strip of lamps; and (d) cutting the continuous strip of lamps into a plurality of sheets each having at least one lamp thereon;

whereby a bottom of the conductor assembly is covered by the lower strip, the strips of foils are secured in each sheet so that a short circuit caused by contacting the upper and the lower strips is substantially eliminated, and each sheet is flexible.

6. The method of claim 5, further comprising sequentially performing the steps of (a), (d), (b) and (c).

7. A lamp on sheet comprising:

an intermediate conductor assembly including two parallel continuous strips of foils out of electrical contact with each other;

a strip assembly including an upper strip and a lower strip, the upper strip having a plurality of spaced pairs of holes aligning with and exposing an upper surface of the two parallel strips of foils; and a light source assembly including a plurality of SMD LEDs, each SMD LED electrically connected to the two parallel continuous strips of foils through one pair of holes;

wherein the two parallel, continuous strips of foils are secured between the upper and the lower strips.

8. The lamp on sheet of claim 7, wherein the strip assembly is selected from a PP, a PVC, or a thin plastic material.

9. The lamp on sheet of claim 7, wherein the strip assembly is selected from a fireproof fabric; a glass-fiber, or an asbestos.

10. A lamp on sheet comprising:

an intermediate conductor assembly including two parallel continuous strips of foils out of electrical contact with each other;

a strip assembly including an upper strip and a lower strip, wherein only the upper strip includes a plurality of spaced large rounded holes aligning with and exposing the two parallel strips of foils; and at least one light source assembly, each light source assembly including at least one LED dice bondings, each LED dice bonding mounted across the strips of foils within one of the rounded holes;

wherein the two parallel, continuous strips of foils are secured between the upper and the lower strips.

11. The lamp on sheet of claim 10, wherein the strip assembly is selected from a PP, a PVC, or a thin plastic material.

12. The lamp on sheet of claim 10, wherein the strip assembly is selected from a fireproof fabric; a glass-fiber, or an asbestos.

13. A lamp on sheet comprising:

an intermediate conductor assembly including two parallel continuous strips of foils;

a strip assembly including an upper strip and a lower strip wherein one or more spaced rounded holes are formed on the upper strip being communication with the strips of foils, and a plurality of pairs of apertures are formed on the strips of foils respectively in a direction from the upper strip to the lower strip by punching; and a light source assembly including one or more bulbs (LED lamp) each inserted through the lower strip and the apertures prior to securing on the strips of foils by soldering;

wherein the strips of foils are secured between the upper and the lower strips.

14. The lamp on sheet of claim 13, wherein the strip assembly is selected from a PP, a PVC, or a thin plastic material.

15. The lamp on sheet of claim 13, wherein the strip assembly is selected from a fireproof fabric; a glass-fiber, or an asbestos.

16. A method of manufacturing lamps on sheet comprising the steps of:

pressing a continuous upper strip, an intermediate conductor assembly including two parallel conductor strips out of electrical contact with each other, and a continuous lower strip into a continuous strip assembly, the upper strip having a plurality of pairs of holes spaced with a predetermined length therealong exposing upper surfaces of the two parallel conductor strips of the conductor assembly;

mounting a light source assembly on the strip assembly to form a continuous strip of lamps by electrically connecting each lamp to the intermediate conductor assembly through a pair of holes; and cutting the continuous strip of lamps into a plurality of sheets each having at least one lamp thereon with a predetermined length of the strip;

wherein the conductor assembly is secured in the strip assembly.

* * * * *